(12) United States Patent
Park et al.

(10) Patent No.: US 12,012,490 B2
(45) Date of Patent: Jun. 18, 2024

(54) COMPOSITION AND HEAT RADIATION SHEET MANUFACTURED THEREFROM

(71) Applicant: LG Chem, Ltd., Seoul (KR)

(72) Inventors: Hyo Soon Park, Daejeon (KR); Je Sik Jung, Daejeon (KR)

(73) Assignee: LG Chem, Ltd., Seoul (KR)

( * ) Notice: Subject to any disclaimer, the term of this patent is extended or adjusted under 35 U.S.C. 154(b) by 588 days.

(21) Appl. No.: 17/282,562

(22) PCT Filed: Jul. 9, 2020

(86) PCT No.: PCT/KR2020/008976
§ 371 (c)(1),
(2) Date: Apr. 2, 2021

(87) PCT Pub. No.: WO2021/006646
PCT Pub. Date: Jan. 14, 2021

(65) Prior Publication Data
US 2021/0340342 A1    Nov. 4, 2021

(30) Foreign Application Priority Data
Jul. 10, 2019    (KR) ........................ 10-2019-0082964

(51) Int. Cl.
*C08J 5/18* (2006.01)
*C08F 20/18* (2006.01)
*C08K 3/22* (2006.01)
*C08K 3/36* (2006.01)
*C08K 5/11* (2006.01)

(52) U.S. Cl.
CPC ................. *C08J 5/18* (2013.01); *C08F 20/18* (2013.01); *C08K 3/22* (2013.01); *C08K 3/36* (2013.01); *C08K 5/11* (2013.01); *C08J 2333/08* (2013.01); *C08K 2003/2227* (2013.01)

(58) Field of Classification Search
CPC ........... C08J 5/18; C08J 2333/08; C08K 3/22; C08K 5/11; C08K 2003/2227; C08K 3/36; C08F 20/18
USPC ......................................................... 524/314
See application file for complete search history.

(56) References Cited

U.S. PATENT DOCUMENTS

| 9,416,254 B2 | 8/2016 | Matsushima | |
| 2008/0081859 A1* | 4/2008 | Yoda ...................... | C08K 5/372 524/323 |
| 2011/0245373 A1* | 10/2011 | Yoda .................... | H01L 23/3737 523/220 |

FOREIGN PATENT DOCUMENTS

| JP | 2006160830 A | 6/2006 |
| JP | 2007056067 A | 3/2007 |
| JP | 2008163126 A | 7/2008 |
| KR | 20050077560 A | 8/2005 |
| KR | 101056694 B1 | 8/2011 |
| KR | 101450924 B1 | 10/2014 |
| KR | 20150105410 A | 9/2015 |
| KR | 20160010455 A | 1/2016 |
| KR | 101798532 B1 | 12/2017 |
| WO | 2019123214 A1 | 6/2019 |

OTHER PUBLICATIONS

International Search Report for Application No. PCT/KR2020/008976 dated Oct. 15, 2020, 3 pages.
Search Report for European Application No. 20837521.2 dated Oct. 25, 2021. 2 pgs.

* cited by examiner

*Primary Examiner* — Hui H Chin
(74) *Attorney, Agent, or Firm* — Lerner David LLP

(57) ABSTRACT

A composition having excellent thermal conductivity and insulating properties and easy of handling includes a thermally conductive filler, a plasticizer, acrylic acid, and an alkyl (meth)acrylate monomer. A heat radiation sheet manufactured from the composition is also provided.

11 Claims, No Drawings

COMPOSITION AND HEAT RADIATION SHEET MANUFACTURED THEREFROM

CROSS-REFERENCE TO RELATED APPLICATIONS

This application is a national phase entry under 35 U.S.C. § 371 of International Application No. PCT/KR2020/008976, filed Jul. 9, 2020, which claims priority to Korean Patent Application No. 10-2019-0082964, filed Jul. 10, 2019, the entire contents of which are incorporated herein by reference.

TECHNICAL FIELD

The present disclosure relates to a composition and a heat radiation sheet manufactured therefrom. Specifically, the present disclosure relates to a composition having excellent insulation properties and a heat radiation sheet manufactured therefrom.

BACKGROUND ART

In recent, with an increase in thermal density caused by high output of electronic devices, the countermeasures against heat radiation are increasingly becoming important. In particular, as the demand for an electric vehicle increases, there is a need for a means for highly efficient heat radiation of a high-capacity battery installed in the electric vehicle.

In order to reduce thermal problems due to overheating of the battery, it is important to quickly transfer heat generated in the device to a radiator such as a coolant or housing in order to prevent adverse effects on surrounding members, and it is common to attach a metallic radiator such as aluminum or copper to the device.

However, for efficient heat radiation and cooling between the radiator and the electronic device, a heat radiation member is essential. A thermally conductive sheet is generally being used as the heat radiation member, and has been widely used to bond a heat sink (a cooling member), a heat radiation sheet, a cooling plate, etc., to electronic devices in order to efficiently cool or radiate heat generated inside the device. Thus, the thermally conductive sheet is required to have high thermal conductivity and sufficient flexibility.

Meanwhile, in the case of attaching a metallic radiator, since the metal is generally conductive, the heat radiation member is also required to have electrical insulation in many cases in order to prevent the problems caused by a short circuit to a coolant or a housing.

However, since a general thermally conductive acrylic sheet has a limitation in achieving high insulation, it is necessary to develop a new thermally conductive sheet having excellent thermal conductivity and insulation.

DISCLOSURE

Technical Problem

The technical problem to be solved by the present disclosure is to provide a composition having excellent thermal conductivity, insulation properties, and ease of handling, and a heat radiation sheet manufactured therefrom.

Technical Solution

According to an aspect of the present disclosure, there is provided a composition containing a thermally conductive filler, a plasticizer, acrylic acid, and an alkyl (meth)acrylate monomer, wherein the acrylic acid is contained in an amount of 0.3 parts by weight to 0.5 parts by weight, based on 100 parts by weight of the alkyl (meth)acrylate monomer.

According to another aspect of the present disclosure, there is provided a heat radiation sheet containing a cured product of the composition and having a surface resistance of $2*10^{13}\Omega/\square$ to $6*10^{13}\Omega/\square$.

Advantageous Effects

The heat radiation sheet according to the present disclosure has excellent thermal conductivity and, when applied to a battery, may have excellent heat radiation performance and insulation properties, thereby preventing the occurrence of problems such as explosion due to overheating of the battery. In addition, the heat radiation sheet according to the present disclosure is easy to handle because it can be wound in a roll form due to low hardness thereof.

MODE FOR INVENTION

In the present specification, "including" any component will be understood to imply the inclusion of other components rather than the exclusion of other components, unless explicitly described to the contrary.

Hereinafter, the present disclosure will be described in more detail.

The composition according to an embodiment of the present disclosure contains a thermally conductive filler; a plasticizer; acrylic acid; and an alkyl (meth)acrylate monomer, wherein the acrylic acid is contained in an amount of 0.3 parts by weight to 0.5 parts by weight, based on 100 parts by weight of the alkyl (meth)acrylate monomer.

According to an embodiment of the present disclosure, the thermally conductive filler may be used to achieve a high level of thermal conductivity in a heat radiation sheet manufactured from the composition, and may be uniformly dispersed and used in the composition.

In addition, the thermally conductive filler may be used in the form of powder or particles, and the shape of the particles may be polygonal, elliptical, spherical, needle-type, plate-type, or flake-type.

According to an embodiment of the present disclosure, the thermally conductive filler may be used with two or more different particle sizes. Specifically, larger-sized particles and smaller-sized particles may be used together. The larger-sized particles may each have a diameter of 8 µm to 30 µm, or 10 µm to 20 µm, and the smaller-sized particles may each have a diameter of 0.5 µm to 5 µm, or 1.5 µm to 5 µm. The larger-sized particles can increase a filling rate and make their processability excellent. The smaller-sized particles can have an effect of preventing sedimentation and improve cohesion.

According to an embodiment of the present disclosure, the thermally conductive filler may be one or more of aluminum hydroxide, aluminum oxide, boron nitride, aluminum nitride, magnesium oxide, magnesium hydroxide, magnesium carbonate, titanium oxide, zinc oxide, silicon carbide, or quartz. Preferably, aluminum hydroxide may be used as the thermally conductive filler in terms of flame retardant and economy.

According to an embodiment of the present disclosure, the thermally conductive filler may be contained in an amount of 500 parts by weight to 1,000 parts by weight, 600 parts by weight to 900 parts by weight, or 700 parts by weight to 850 parts by weight, based on 100 parts by weight of the alkyl (meth)acrylate monomer. If the thermally conductive filler is contained within the above range, the heat radiation sheet containing a cured product of the composition may have sufficient thermal conductivity and flexibility.

According to an embodiment of the present disclosure, the plasticizer may be contained in the composition in order to improve the flexibility of the heat radiation sheet.

According to an embodiment of the present disclosure, the plasticizer may have a viscosity of 10 cp to 450 cp, 20 cp to 450 cp, or 20 cp to 430 cp. If the plasticizer having a viscosity within the above range is used, coating properties may be excellent in the process of manufacturing a sheet by appropriately adjusting the viscosity of the composition.

According to an embodiment of the present disclosure, the plasticizer may be one or more of triethylhexyl trimellitate, triisononyl trimellitate, or diisononyl adipate. Preferably, the plasticizer may be diisononyl adipate.

According to an exemplary embodiment of the present disclosure, the plasticizer may have a boiling point of 200° C. to 450° C., 210° C. to 420° C., or 210° C. to 310° C. If the boiling point of the plasticizer is within the above range, the plasticizer may not easily evaporate even though the heat radiation sheet containing the cured product of the composition is exposed to high temperature for a long time, and thus curing of the sheet may be prevented, thereby maintaining excellent adhesion and thermal performance.

According to an embodiment of the present disclosure, the plasticizer may be contained in an amount of 30 to 80 parts by weight, 40 to 60 parts by weight, or 40 to 55 parts by weight, based on 100 parts by weight of the alkyl (meth)acrylate monomer. If the plasticizer is contained in an amount within the above range, the plasticizer may not excessively reduce the viscosity of the composition while imparting sufficient flexibility to the heat radiation sheet, and even when stored for a long time, the occurrence of bleeding, which is a phenomenon in which plasticizers leak out, may be prevented.

According to an embodiment of the present disclosure, the acrylic acid may be added to the composition in order to minimize a decrease in viscosity of the composition, to maintain thermal conductivity and flexibility of the heat radiation sheet, and to improve electrical insulation without compromising process stability.

According to an embodiment of the present disclosure, the acrylic acid is contained in an amount of 0.3 to 0.5 parts by weight, 0.33 to 0.5 parts by weight, or 0.33 to 0.4 parts by weight, based on 100 parts by weight of the alkyl (meth)acrylate monomer. If the composition contains acrylic acid in an amount within the above range, it is possible to manufacture a heat radiation sheet having low thermal resistance, high thermal conductivity, high surface resistance, excellent insulation properties, low dielectric constant, and high dielectric retention ratio.

According to an embodiment of the present disclosure, the alkyl (meth)acrylate monomer may serve as a binder by being added to the composition. Specifically, the alkyl (meth) acrylate monomer may be contained in order to bind other components contained in the composition, such as a thermally conductive filler and a plasticizer, to each other.

According to an embodiment of the present disclosure, the alkyl (meth)acrylate monomer may contain an alkyl (meth)acrylate in which the alkyl has 1 to 15 carbon atoms or 7 to 15 carbon atoms.

According to an embodiment of the present disclosure, the alkyl (meth)acrylate monomer may contain one or more of methyl (meth)acrylate, ethyl (meth)acrylate, propyl (meth)acrylate, isopropyl (meth)acrylate, butyl (meth)acrylate, isobutyl (meth)acrylate, pentyl (meth) acrylate, neopentyl (meth) acrylate, 2-ethylhexyl (meth)acrylate, 2-ethylbutyl (meth)acrylate, octyl (meth)acrylate, isooctyl (meth) acrylate, isononyl (meth)acrylate, lauryl (meth)acrylate, or tetradecyl (meth)acrylate. Preferably, the alkyl (meth)acrylate monomer may be 2-ethylhexyl (meth)acrylate.

According to an embodiment of the present disclosure, the alkyl (meth)acrylate monomer may have a glass transition temperature of −100° C. or more and 0° C. or less, and a boiling point of 200° C. or more and 300° C. or less.

The composition according to an embodiment of the present disclosure may be a photocurable composition, and may contain a photoinitiator and a photocuring agent. The photoinitiator serves to initiate a curing reaction by generating radicals by light during light irradiation, and the photocuring agent serves to improve mechanical strength and stability of the cured product by curing the composition.

The composition according to an embodiment of the present disclosure may further contain one or more of coupling agents, antioxidants, metal deactivator, flame retardants, tackifiers, precipitation inhibitors, thixotropic agents, surfactants, antifoaming agents, colorants, or antistatic agents.

A heat radiation sheet according to another embodiment of the present disclosure contains a cured product of the composition according to the present disclosure, and has a surface resistance of $2*10^{13} \Omega/\square$ to $6*10^{13} \Omega/\square$.

According to an embodiment of the present disclosure, the heat radiation sheet may contain a photocured product of the composition according to the present disclosure. Specifically, the heat radiation sheet may contain a photocured product cured by irradiating the composition according to the present disclosure with UV light of 5 mW/cm$^2$ to 7 mW/cm$^2$ for 10 minutes using an ultraviolet light source having a wavelength of 100 nm to 400 nm, 300 nm to 400 nm, or 315 nm to 400 nm.

According to an embodiment of the present disclosure, the heat radiation sheet may have a surface resistance of $2*10^{13}\Omega/\square$ to $6*10^{13}\Omega/\square$, **$2*10^{13}\Omega/\square$** to $5.5*10^{13}\Omega/\square$, or $2*10^{13}\Omega/\square$ to $5*10^{13}\Omega/\square$. When the heat radiation sheet having a surface resistance within the above range is applied to a battery pack for an electric vehicle, there is no risk of electric shock and the vehicle and the battery may thus be protected.

According to an embodiment of the present disclosure, the heat radiation sheet may have insulation properties of 5800 kΩ to 6000 kΩ, 5800 kΩ to 5975 kΩ, or 5800 kΩ to 5950 kΩ. Specifically, the insulation properties of the heat radiation sheet may be measured by interposing the heat radiation sheet between a grounded protective conductor and a battery as an active conductor in a battery system, connecting the positive and negative electrodes of a measuring instrument to a ground circuit of the protective conductor and a charging portion of the battery, respectively, applying a DC voltage of 300 V to 700 V for 40 to 80 seconds, and then measuring the resistance value of the heat radiation sheet. When the heat radiation sheet having the insulation properties within the above range is applied to a battery pack for an electric vehicle, there is no risk of electric shock, and the vehicle and the battery may thus be protected.

According to an embodiment of the present disclosure, the heat radiation sheet may have a Shore 00 hardness of 70 to 80. If the heat radiation sheet has low Shore 00 hardness within the above range, the heat radiation sheet may be wound in a roll form and may thus be easily handled.

According to an embodiment of the present disclosure, the heat radiation sheet may have a capacitance value of less than 0.2 nF or less than 0.18 nF. The capacitance value may be a capacitance value measured by interposing the heat radiation sheet between conductive substrates and connecting a measuring instrument such as a U1250A multimeter (Agilent Technologies, Inc.) to the conductive substrates. If the heat radiation sheet has a small capacitance value within the above range, it may have excellent insulation and may thus have high stability.

According to an embodiment of the present disclosure, the heat radiation sheet may have a thickness of 1.0 mm to 3.0 mm or 2.0 mm to 3.0 mm. The heat radiation sheet having a thickness within the above range may be wound in a roll form and may thus be easily handled, and when applied to a battery pack for an electric vehicle, the heat radiation sheet may have excellent thermal conductivity and excellent step difference absorption between a module and a cooling plate.

According to an embodiment of the present disclosure, the heat radiation sheet may have a dielectric constant of 3 to 4 or 3.3 to 3.6 at a frequency of 1 KHz. The lower the dielectric constant, the better the insulation properties, and if the dielectric constant of the heat radiation sheet is within the above range, it may have excellent insulation properties and may thus have high stability.

According to an embodiment of the present disclosure, the heat radiation sheet may have a dielectric retention ratio of 60% to 75%, or 60% to 70%. Specifically, the dielectric constant of a polar material decreases as the frequency increases. Thus, the better the dielectric constant is maintained despite the increase in frequency, that is, the higher the dielectric retention ratio, the better the insulation properties may be maintained even if the use environment changes. The dielectric retention ratio may be a value calculated according to Equation 1 below. If the dielectric retention ratio of the heat radiation sheet is within the above range, the heat radiation sheet may have excellent insulation properties and may thus have high stability:

Dielectric retention ratio (%)=Measured value of dielectric constant at 1 MHz/Measured value of dielectric constant at 1 KHz*100  [Equation 1]

According to an embodiment of the present disclosure, the heat radiation sheet may have a heat resistance of 1.6 K-in$^2$/W to 1.7 K-in$^2$/W, or 1.65 K-in$^2$/W to 1.7 K-in$^2$/W, and a thermal conductivity of 1.55 W/mK to 1.6 W/mK. The heat radiation sheet having thermal resistance and thermal conductivity within the above ranges may efficiently discharge heat generated during the operation of a battery for an electric vehicle due to excellent thermal conductivity and thus reduce the possibility of overheating and malfunction of the battery for the electric vehicle, resulting in excellent stability.

Mode for Carrying Out Invention

Hereinafter, examples will be described in detail in order to describe the present disclosure in detail. However, the examples according to the present disclosure may be modified in various other forms, and the scope of the present disclosure is not construed as being limited to the examples described below. The examples in the present specification are provided in order to more completely describe the present disclosure to those having average knowledge in the art.

Example 1

500 g of aluminum hydroxide (Osung Industry Co., Ltd., OSA-20, D50=20 μm, purity 99.5% or more, etc.) and 130 g of aluminum hydroxide (Martinal OL-104LEO, D50=1.9 μm, purity 99.5% or more) as a thermally conductive filler, 100 g of 2-ethylhexyl (meth)acrylate, 0.5 g of acrylic acid, 5 g of a coupling agent (Borica, Tytan CP-318, stearyl titanate), 50 g of diisononyl adipate (Aekyung Petrochemical, viscosity 20 cps, boiling point 216° C.) as a plasticizer, 0.35 g of 1,6-hexanediol diacrylate as a curing agent, and 1 g of Irgacure 651 (BASF) as a photoinitiator were mixed and stirred to prepare a composition. The composition was applied onto a PET substrate (Osung Industry Co., Ltd., 75OS-UH02, silicone release PET) and irradiated with 7 mW/cm$^2$ of UV for 10 minutes and photocured to manufacture a heat radiation sheet having a final thickness of 2.0 mm.

Example 2

A heat radiation sheet was manufactured in the same manner as in Example 1, except that 0.33 g of acrylic acid was added.

Comparative Example 1

A heat radiation sheet was manufactured in the same manner as in Example 1, except that acrylic acid was not added.

Comparative Example 2

A heat radiation sheet was manufactured in the same manner as in Example 1, except that 1 g of acrylic acid was added.

Measurements of Surface Resistance and Insulation Properties

Using MCP-HT800 (Mitsubishi Chemical), a voltage of 500 V was applied for 60 seconds to measure the surface resistance of each of the heat radiation sheets manufactured in Examples 1 and 2, and Comparative Examples 1 and 2. After measuring the surface resistance five times, an average of three median values was taken and shown in Table 1.

In addition, the insulation properties of the heat radiation sheets were measured by interposing each of the heat radiation sheets manufactured in Examples 1 and 2, and Comparative Examples 1 and 2 between a cooling plate (LT Precision Inc.) as a grounded protective conductor and a battery (LG Chem, Ltd.) as an active conductor, in a vehicle battery system manufactured using a pouch-type battery cell, connecting the positive and negative electrodes of a measuring instrument to the ground protective conductor circuit and a charging portion of the battery, respectively, applying a DC voltage of 500 V for 60 seconds, and then measuring the resistance value of the heat radiation sheet.

Measurement of Capacitance

The heat radiation sheets manufactured in Examples 1 and 2, and Comparative Examples 1 and 2 were cut into 50 cm*100 cm, and SUS 304 (Jaehyun Company) was cut into 70 cm*100 cm, to prepare two. A laminate was manufactured by laminating a heat radiation sheet on a lower SUS substrate, and laminating an upper SUS substrate on the heat radiation sheet. The capacitance was measured by connecting each of the upper and lower SUS substrates to a multimeter U1250A (Agilent Technologies, Inc.) having a resolution of 0.001 nF. The measured values are shown in Table 1.

Measurement of Dielectric Constant and Retention Ratio

The dielectric constant of each of the heat radiation sheets manufactured in Examples 1 and 2, and Comparative Examples 1 and 2 was measured by using an E4980A (Agilent Technologies, Inc.) and a precision LCR meter under the condition of a frequency of 1 KHz. In addition, the dielectric constant thereof was measured by using an E4980A (Agilent Technologies, Inc) and a precision LCR meter under the condition of a frequency of 1 MHz, and then the dielectric retention ratio was calculated according to Equation 1. The values of the dielectric constant at a frequency of 1 KHz and the dielectric retention ratio calculated according to Equation 1 are shown in Table 1.

Measurement of Thermal Resistance and Thermal Conductivity

The thermal resistance and thermal conductivity of each of the heat radiation sheets manufactured in Examples 1 and 2, and Comparative Examples 1 and 2 were measured by using a TIM Tester 1300 (Analysis Tech Co., Ltd.) under 40 psi conditions, and the measurement results are shown in Table 1.

Measurement of Hardness

The Shore 00 hardness of each of the heat radiation sheets manufactured in Examples 1 and 2, and Comparative Examples 1 and 2 was measured by using an analog value derived by applying a load for 30 seconds with a 6T sample (400 g load) using ASTM D2240 standard HD3000, OS-00 model (Hildebrand Technology AG). The measured hardnesses are shown in Table 1.

It can be seen from Table 1 that the respective heat radiation sheets manufactured in Examples 1 and 2 had a high surface resistance, an insulation properties of 5800 kΩ or more, low capacitance value of less than 0.18 nF, a dielectric constant of about 3.3 or more and a dielectric retention ratio of 66% or more, and due to excellent stability, low thermal resistance and high thermal conductivity thereof, the heat radiation sheets can smoothly discharge heat generated during battery operation, and had low Shore 00 hardnesses of 73 and 75, respectively.

On the other hand, the heat radiation sheet manufactured in Comparative Example 1 had too low surface resistance, inferior insulation properties, a capacitance value of 0.260 nF, which was too large, a high dielectric constant, and a low dielectric retention ratio, so that there may be a risk of electric shock when the heat radiation sheet is applied to a batter pack for an electric vehicle. That is, since the heat radiation sheet manufactured in Comparative Example 1 had inferior insulation properties, it may have inferior stability when applied to a battery pack for an electric vehicle.

It can be confirmed that the heat radiation sheet manufactured in Comparative Example 2 had very high thermal resistance and very low thermal conductivity. Thus, the heat radiation sheet may have difficulty in discharging the heat, thereby leading to battery overheating and increasing the possibility of explosion and malfunction, and the heat radiation sheet is difficult to handle because it cannot be wound in a roll form due to high Shore 00 hardness of 85.

In summary, it can be seen that the heat radiation sheet according to an exemplary embodiment of the present disclosure has excellent thermal conductivity and insulation properties, and is easy to handle due to an appropriate level of hardness, whereas when the composition for the heat radiation sheet containing no acrylic acid as in Comparative Example 1 is used, the effect of the present disclosure cannot be achieved due to the inferior insulation properties thereof, and when the composition for the heat radiation sheet containing an excess amount of acrylic acid as in Comparative Example 2 is used, the effect of the present disclosure cannot be achieved due to the inferior thermal conductivity and high hardness thereof.

The invention claimed is:

1. A composition comprising:
a thermally conductive filler;
a plasticizer; acrylic acid; and
an alkyl (meth)acrylate monomer,
wherein the acrylic acid is contained in an amount of 0.3 parts by weight to 0.5 parts by weight, based on 100 parts by weight of the alkyl (meth)acrylate monomer;
wherein the plasticizer is one or more of triethylhexyl trimellitate, triisononyl trimellitate, or diisononyl adipate, and

TABLE 1

| | Surface resistance (Ω/□) | Insulation properties (kΩ) | Capacitance (nF) | Dielectric constant | Dielectric retention ratio (%) | Thermal conductivity (W/mK) | Thermal resistance (K-in²/W) | Hardness (Shore 00) |
|---|---|---|---|---|---|---|---|---|
| Example 1 | $2.03*10^{13}$ | 5815 | 0.174 | 3.57 | 66 | 1.57 | 1.697 | 73 |
| Example 2 | $5.00*10^{13}$ | 5904 | 0.165 | 3.36 | 70 | 1.55 | 1.699 | 75 |
| Comp. Example 1 | $1.85*10^{11}$ | 1400 | 0.260 | 5.61 | 50 | 1.58 | 1.608 | 65 |
| Comp. Example 2 | $5.15*10^{13}$ | 5418 | 0.169 | 3.25 | 73 | 1.50 | 1.782 | 85 | wherein the plasticizer is contained in an amount of 30 parts by weight to 80 parts by weight, based on 100 parts by weight of the alkyl (meth)acrylate monomer.

2. The composition of claim 1, wherein the thermally conductive filler is one or more of aluminum hydroxide, aluminum oxide, boron nitride, aluminum nitride, magnesium oxide, magnesium hydroxide, magnesium carbonate, titanium oxide, zinc oxide, silicon carbide, or quartz.

3. The composition of claim 1, wherein the thermally conductive filler is contained in an amount of 500 parts by weight to 1000 parts by weight, based on 100 parts by weight of the alkyl (meth)acrylate monomer.

4. The composition of claim 1, wherein the plasticizer has a viscosity of 10 cp to 450 cp.

5. The composition of claim 1, wherein the plasticizer has a boiling point of 200° C. to 450° C.

6. The composition of claim 1, wherein the alkyl (meth)acrylate monomer contains an alkyl (meth)acrylate in which the alkyl has 1 to 15 carbon atoms.

7. The composition of claim 1, wherein the alkyl (meth)acrylate monomer contains one or more of methyl (meth)acrylate, ethyl (meth)acrylate, propyl (meth)acrylate, isopropyl (meth)acrylate, butyl (meth)acrylate, isobutyl (meth)acrylate, pentyl (meth)acrylate, neopentyl (meth)acrylate, 2-ethylhexyl (meth)acrylate, 2-ethylbutyl (meth)acrylate, octyl (meth)acrylate, isooctyl (meth)acrylate, isononyl (meth)acrylate, lauryl (meth)acrylate, or tetradecyl (meth)acrylate.

8. The composition of claim 1, further comprising a photoinitiator and a photocuring agent.

9. A heat radiation sheet comprising a cured product of the composition of claim 1 and having a surface resistance of $2*10^{13} \Omega/\square$ to $6*10^{13} \Omega/\square$.

10. The heat radiation sheet of claim 9, wherein a Shore 00 hardness of the heat radiation sheet is 70 to 80.

11. The heat radiation sheet of claim 9, wherein a thickness of the heat radiation sheet is 1.0 mm to 3.0 mm.

* * * * *